United States Patent
Kloster et al.

(10) Patent No.: US 6,930,391 B2
(45) Date of Patent: Aug. 16, 2005

(54) METHOD FOR ALLOY-ELECTROPLATING GROUP IB METALS WITH REFRACTORY METALS FOR INTERCONNECTIONS

(75) Inventors: Grant M. Kloster, Lake Oswego, OR (US); Sean J. Hearne, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/228,539

(22) Filed: Aug. 27, 2002

(65) Prior Publication Data

US 2004/0041264 A1 Mar. 4, 2004

(51) Int. Cl.⁷ .............................................. H01L 23/48
(52) U.S. Cl. ...................................... 257/741; 257/762
(58) Field of Search .............................. 257/741, 762, 257/750, 751, 761–4, 766, 770–1; 438/648, 650, 656, 683, 685, 686, 687

(56) References Cited

U.S. PATENT DOCUMENTS

| | | | |
|---|---|---|---|
| 5,391,517 A | * 2/1995 | Gelatos et al. | 438/643 |
| 5,442,235 A | * 8/1995 | Parrillo et al. | 257/758 |
| 5,969,422 A | 10/1999 | Ting et al. | |
| 6,025,275 A | 2/2000 | Efland et al. | |
| 6,121,149 A | * 9/2000 | Lukanc et al. | 438/692 |
| 6,221,763 B1 | 4/2001 | Gilton et al. | |
| 6,235,406 B1 | 5/2001 | Uzoh | |
| 6,323,128 B1 | 11/2001 | Sambucetti et al. | |
| 6,375,708 B1 | * 4/2002 | Dorfman et al. | 75/248 |

FOREIGN PATENT DOCUMENTS

| | | | | |
|---|---|---|---|---|
| EP | 0753592 A1 | * | 1/1997 | .......... C22C/27/04 |
| JP | 08-107166 A | * | 4/1996 | .......... H01L/23/36 |
| JP | 408107166 A | * | 4/1996 | .......... H01L/23/36 |

OTHER PUBLICATIONS

J.A. Cunningham, Ph.D., Semiconductor International (Apr., 2000).
K. Barmak, et. al., Journal of Applied Physics, v. 87, No. 5, p. 2204 (2000).
O.Younes and E. Gileadi, Electrochemical and Solid–State Letters, 3, p. 543 (2000).
E.J. Podlaha and D. Landolt, J. Electrochemical Soc., v. 144, No. 5, p. 1672 (May, 1997).

* cited by examiner

Primary Examiner—Wael Fahmy
Assistant Examiner—Ginette Peralta
(74) Attorney, Agent, or Firm—Blakely, Sokoloff, Taylor and Zafman (57) ABSTRACT

An electroplated metal alloy including at least three elements. A multilayer interconnection structure that includes a substrate that is an interior of the interconnection structure, a conductive seed layer exterior to the substrate, and an electroplated metal alloy layer including at least three elements exterior to the conductive seed layer. A multilayer interconnection structure formed on a substrate, that includes a barrier layer, and a conductive seed layer, wherein the improvement includes an electroplated metal alloy layer including at least three elements. A method for forming a multilayer interconnection structure that includes providing a substrate, depositing a conductive seed layer, and electroplating a metal alloy layer including at least three elements exterior to the conductive seed layer.

16 Claims, 6 Drawing Sheets

METHOD FOR ALLOY-ELECTROPLATING GROUP IB METALS WITH REFRACTORY METALS FOR INTERCONNECTIONS

BACKGROUND

1. Field

Circuit structures interconnecting individual devices of a circuit.

2. Relevant Art

One direction in improving integrated circuit technology is to reduce the size of the components or devices on a chip, permitting an increased number of devices on the chip. The reduction in size of the devices on an integrated circuit chip requires reductions in the widths and thicknesses of the interconnections that connect the devices on the chip.

At present, the combination of the interconnect's reduced cross-sectional area with the electrical current requirements of the transistors result in large current densities within the interconnect. It is known that large current density can cause migration of some of the interconnect material (ref. FM D'Heurle and A Gangulee, *Thin Solid Films* 25, p. 531 (1975)).

Migration of the interconnect material has been generally accepted to be the result of electrons colliding with the atoms within the interconnect. The collisions occasionally cause atoms to dislodge and move in the direction of the electron flow via one of three routes: interstitially, along grain boundaries, or along the free surface. If the migration flow of atoms away from the interconnect is greater than a flow of source atoms to the interconnect, a void will form. Growth of the void will eventually result in an opening being formed in the interconnect. The ability of the interconnect material to resist this failure mode is referred to as the electromigration resistance. Electromigration resistance is a primary factor limiting interconnect materials longevity. One way to increase performance, reliability, and power consumption of integrated circuit interconnections is by improving the electromigration lifetime.

Where three grain boundaries meet, a triple point junction is formed. Such junctions are randomly dispersed throughout the interconnection and extend in a variety of directions that define potential inlet and outlet routes for displaced copper atoms during current flow. As electrical current flows through the interconnection, copper atoms are displaced by the electrons. These displaced copper atoms accumulate in the grain boundaries that are downstream of the current and travel along the grain boundaries in the general direction of the current. At grain boundary junctions that have fewer upstream inlets than downstream outlets, a void may develop at that grain boundary junction over time as copper atoms erode form the junction.

Figure 1:
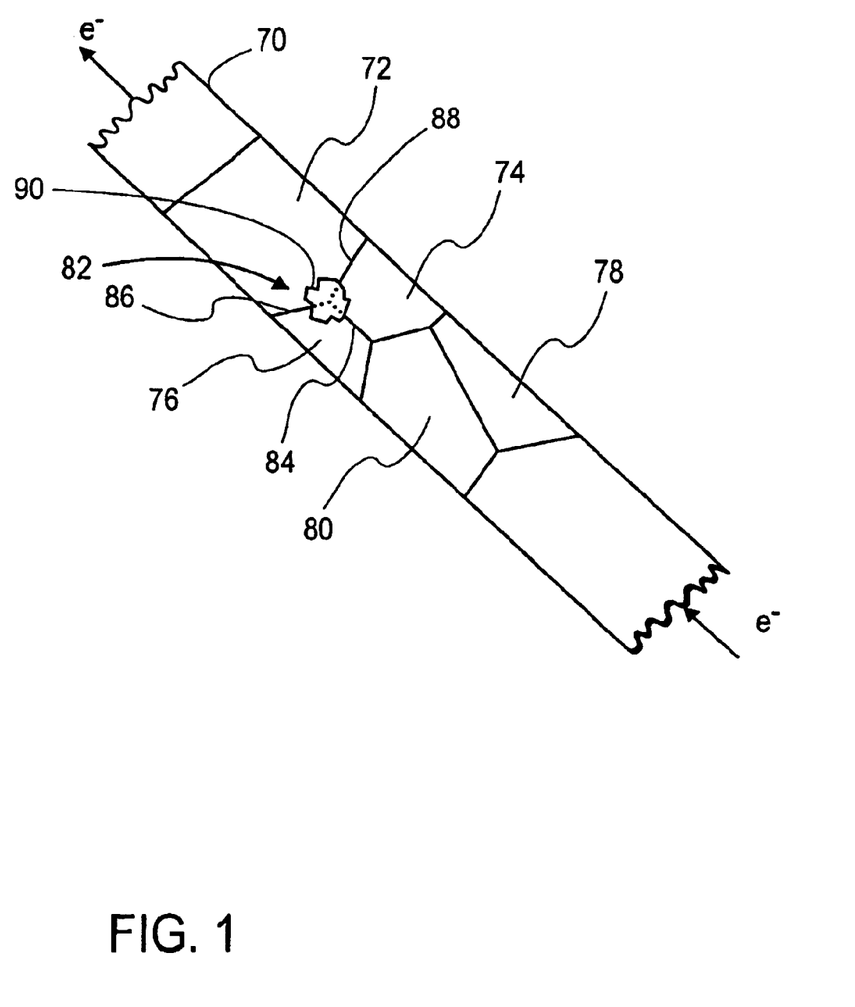
FIG. 1 is a schematic illustration of grain boundaries of copper crystals in a copper interconnection.

FIG. 1 schematically illustrates a copper interconnection and shows a number of junctions created by adjacent copper crystals. Interconnection 70 is formed, in this example, by copper crystal 72, copper crystal 74, copper crystal 76, copper crystal 78, and copper crystal 80. Grain boundary junction 82 is formed by the meeting of inlet grain boundary 84, outlet grain boundary 86, and outlet grain boundary 88, the designation of inlet and outlet being dictated by the indicated direction of the flow of electrons. With one upstream inlet and two downstream outlets, more copper atoms can be expected to leave junction 82 through two downstream outlets 86 and 88 then are supplied to junction 82 through one upstream inlet 84. With more copper atoms being removed from junction 82 within interconnection 70 than are being supplied to junction 82 from its upstream source, here inlet grain boundary 84, void 90 will eventually develop in interconnection 70 at junction 82.

Modern interconnections are made principally of a polycrystalline metal consisting of copper, aluminum, or an aluminum alloy. Electromigration resistance of these metals may not be sufficient in future generations of integrated circuits due to the increased current density.

Several techniques have been developed to improve the electromigration lifetime of an interconnection. These techniques include improved texture, interlayers to limit void size, and interconnections of multiple layers of material.

The introduction of refractory metals into integrated circuits has been hindered by the inability to deposit the alloys using electrodeposition from an aqueous solution. It is not currently possible to directly plate refractory metals from an aqueous solution.

BRIEF DESCRIPTION OF THE DRAWINGS

FIGS. 10 and 11 show SIMS depth profiling of nickel and tungsten concentrations in the copper-nickel-tungsten co-plated films: FIG. 10 before annealing, and FIG. 11 after annealing four hours at 425° C. in nitrogen.

The features of the described embodiments are specifically set forth in the appended claims. The embodiments are best understood by referring to the following description and accompanying drawings, in which similar parts are identified by like reference numerals.

DETAILED DESCRIPTION

An interconnection is disclosed that, in one embodiment, includes a metal alloy formed, for example, on a substrate of an integrated circuit chip.

In one embodiment, there is disclosed a technique to enable the electrodeposition of a group IB metal (for example, copper, silver, or gold) with a refractory metal (for example, tungsten, molybdenum, titanium, etc.) using an aqueous solution compatible with current integrated interconnect circuit technologies.

In one embodiment, a technique is described that details the uses of under-potential deposition of a refractory metal in conjunction with electrodeposition of group IB metals (copper, silver, and/or gold) to produce an alloy of the constituent metals. The alloy can contain one or more of each of the following components, a refractory metal, a group IB metal, and an iron like metal (for example, iron, nickel, or cobalt).

A common method of utilizing interconnections in integrated circuits includes, but is not limited to, as part of the multilayer interconnection structure or interconnection stack. Examples include placing the primary interconnection material, such as for example, copper, between titanium and/or titanium nitride (TiN) or between tantalum (Ta) and/or tantalum nitride (TaN). The titanium or tantalum materials act, in one sense, as diffusion barriers between the primary interconnection material and other layers above or below the primary interconnection material.

Reference is made to FIGS. 2–5 to illustrate an interconnection stack and its manufacturing according to one embodiment. The interconnection stack will connect, for example, individual devices on a chip or signals to or from the chip. A typical chip might have interconnection stacks made up of five or more layers, each interconnection stack separated from other interconnection stacks by pre-metal dielectric (PMD) or interlayer dielectric (ILD) material. Interconnections, in the context of circuit structures, include layer or lines (of interconnection stack material) coupled to contact points including circuit devices (e.g., transistors, capacitors, resistors) or other interconnection layers or lines.

One process used to form interconnections (interconnection stacks), particularly copper interconnections, is a damascene process. In a damascene process, a trench is cut in a dielectric material and filled with interconnection material (e.g., interconnection stack material) to form the interconnection. A via may be in the dielectric beneath the trench with a conductive material in the via to couple the interconnection (interconnection stack) to a contact point (e.g., an underlying circuit device or interconnection). In one damascene process (a "dual damascene process"), the trench and via are each filled with the interconnection material (interconnection stack material).

In one embodiment, the interconnect material is deposited using electrodeposition, because of its unique ability to plate trenches and vias at higher rates than the field. In this embodiment, the interconnect material may include a group IB metal (for example, copper, silver, or gold), alloyed with nickel, iron, or cobalt, and a refractory metal such as tungsten (W), molybdenum (Mo), tantalum (Ta), or titanium (Ti).

FIGS. 2–5 describe the formation of an interconnection stack according to an embodiment to a contact point on a substrate, such as, for example, a semiconductor (e.g., silicon) substrate that may have a plurality of devices formed in and on the substrate. The interconnection stack described may be a TaN/Ta/Cu seed layer/ternary metal alloy. (FIGS. 2–5 are not drawn to scale, and are not meant to show the relative thicknesses of the layers.)

Figure 2:
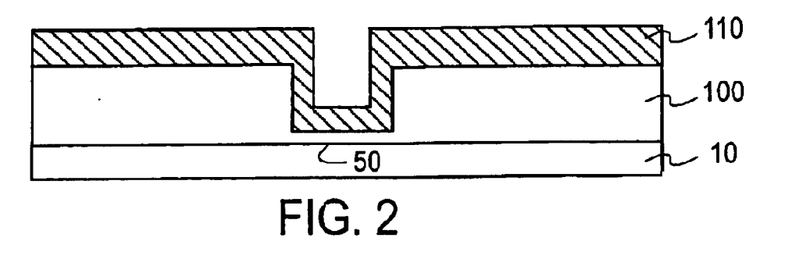
FIG. 2 is a cross-section of a tantalum-nitride or titanium-nitride underlayer on an interlayer dielectric in accordance with an embodiment of an interconnection stack.

FIG. 2 shows the substrate after patterning tantalum-nitride layer 110 over PMD, in the case of dielectric material directly over a device substrate, or ILD layer 100. PMD or ILD layer 100 is formed on substrate 10 over contact point 50 that may be a circuit device or interconnection. In one embodiment, to form an interconnection stack having a thickness of, for example, about 4500 angstrom to about 5000 angstrom, tantalum-nitride layer 110 is deposited to a thickness of, for example, about 400 angstrom by use of direct current (DC) magnetron sputtering in an atmosphere of argon and nitrogen at a total pressure of about five (5) mtorr, with a deposition rate of about 20 angstroms per second.

In one embodiment, substrate 10 defines an interior of a multilayer apparatus, with PMD or ILD layer 100 formed exterior to substrate 10, with tantalum-nitride layer 110 formed exterior to PMD or ILD layer 100, and exterior to substrate 10.

Figure 3:
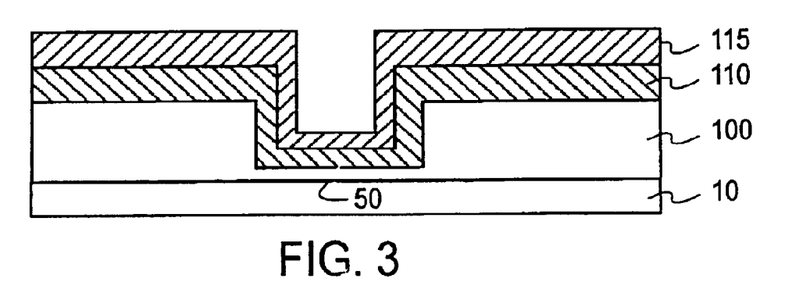
FIG. 3 is the interconnection stack of FIG. 2 after the further processing of patterning a tantalum, tungsten, cobalt, or titanium interlayer in accordance with an embodiment of an interconnection stack.

As shown in FIG. 3, tantalum layer 115 may then be deposited over tantalum-nitride layer 110. In one embodiment, to form an interconnection stack having a thickness of, for example, about 4500 angstroms to about 5000 angstroms, tantalum layer 115 is deposited to a thickness of, for example, about 400 angstroms by use of direct current (DC) magnetron sputtering in an atmosphere of argon at a total pressure of about five (5) mtorr, with a deposition rate of about 20 angstroms per second.

In one embodiment, substrate 10 defines an interior of a multilayer apparatus. PMD or ILD layer 100 is formed exterior to substrate 10. Tantalum-nitride or titanium-nitride layer 110 may the be formed exterior to PMD or ILD layer 100 and exterior to substrate 10. A tantalum, tungsten, cobalt, or titanium layer 115 may then be formed exterior to titanium-nitride or tantalum-nitride layer 110, exterior to PMD or ILD layer 100, and exterior to substrate 10. In one embodiment, titanium-nitride or tantalum-nitride layer 110 is optional.

Figure 4:
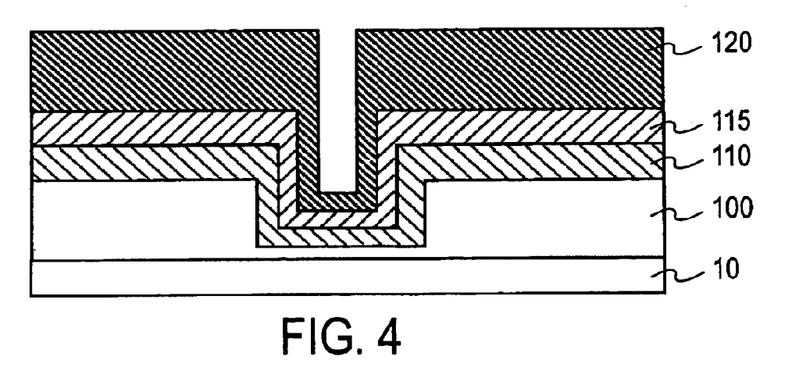
FIG. 4 is the interconnection stack of FIG. 3 after the further processing of patterning a seed layer in accordance with an embodiment of an interconnection stack.

FIG. 4 shows the interconnection stack after the further processing of depositing seed layer 120 on the surface of tantalum layer 115. In one embodiment, seed layer 120 is, for example, a copper material deposited using sputtering deposition techniques. In one embodiment, the sputtering deposition is carried out in an argon atmosphere having a pressure of about 5 mtorr. In one embodiment, the deposition rate is about 20 angstroms per second. In one embodiment, seed layer 120 has a thickness of about 1200 angstroms.

In one embodiment, substrate 10 defines an interior of a multilayer apparatus. PMD or ILD layer 100 is formed exterior to substrate 10. Titanium-nitride or tantalum-nitride layer 110 is formed exterior to exterior to PMD or ILD layer 100, and exterior to substrate 10. Tantalum, tungsten, cobalt, or titanium layer 115 is formed exterior to titanium-nitride or tantalum-nitride layer 110, PMD or ILD layer 100, and exterior to substrate 10. Conductive seed layer 120 is formed exterior to tantalum, tungsten, cobalt, or titanium layer 115, exterior to titanium-nitride or tantalum-nitride layer 110, exterior to PMD or ILD layer 100, and exterior to substrate 10. In one embodiment, titanium-nitride or tantalum-nitride layer 110 is optional.

Figure 5:
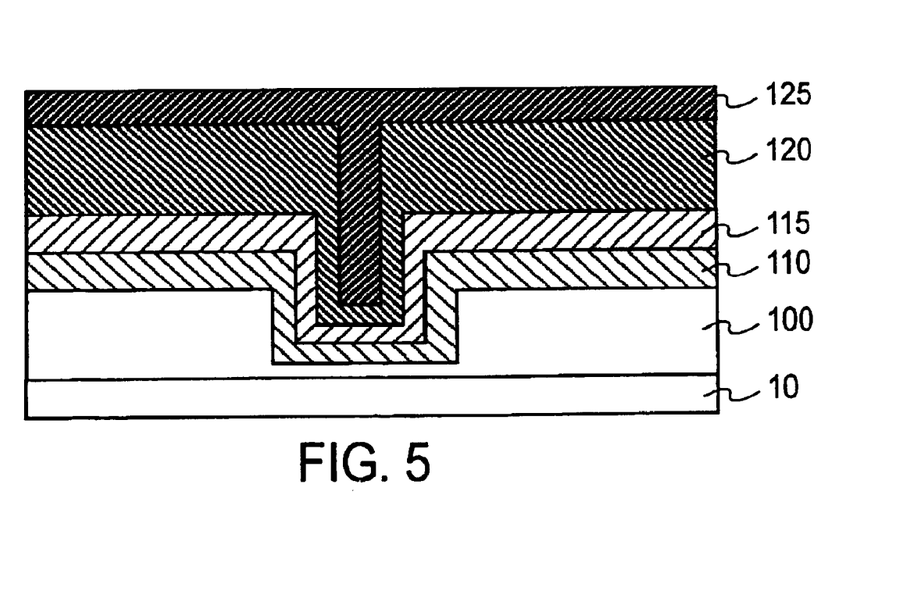
FIG. 5 is the interconnection stack of FIG. 4 after the further processing of electroplating a metal alloy in accordance with an embodiment of an interconnection stack.

FIG. 5 shows the interconnection stack after electroplating metal alloy layer 125 over seed layer 120. In one embodiment, metal alloy layer 125 is a ternary alloy of three elements. In another embodiment, a first element is copper. In another embodiment, a first element is copper and a second element is tungsten. In another embodiment, a first element is copper, a second element is tungsten, and a third element is nickel. In another embodiment, a first element is copper, a second element is tungsten, and a third element is selected from iron (Fe), cobalt (Co), and/or nickel (Ni).

In one embodiment, substrate 10 defines an interior of a multilayer apparatus. PMD or ILD layer 100 is formed exterior to substrate 10. Titanium-nitride or tantalum-nitride layer 110 is formed exterior to PMD or ILD layer 100, and exterior to substrate 10. Tantalum, tungsten, cobalt, or titanium layer 115 is formed exterior to titanium-nitride of tantalum-nitride layer 110, exterior to PMD or ILD layer 100, and exterior to substrate 10. Conductive seed layer 120 is formed exterior to tantalum, tungsten, cobalt, or titanium layer 115, exterior to titanium-nitride or tantalum-nitride layer 110, exterior to PMD or ILD layer 100, and exterior to substrate 10. Metal alloy layer 125 is formed exterior to seed layer 120, exterior to tantalum, tungsten, cobalt, or titanium layer 115, exterior to titanium-nitride or tantalum-nitride layer 110, exterior to PMD or ILD layer 100, and exterior to substrate 10. In one embodiment, titanium-nitride or tantalum-nitride layer 110 is optional.

In another embodiment, the first element is copper, and the second element is selected from tungsten (W), molybdenum (Mo), tantalum (Ta), and/or titanium (Ti). In another embodiment, the first element is copper, the second element is selected from tungsten (W), molybdenum (Mo), and/or tantalum (Ta); and the third element is selected from iron (Fe), cobalt (Co), and/or nickel (Ni). In another embodiment, the first element is copper, the second element is selected from tungsten (W), molybdenum (Mo), tantalum (Ta), and/or titanium (Ti); and the third element is selected from iron (Fe), cobalt (Co), and/or nickel (Ni).

In terms of electroplating a metal alloy, in one embodiment, the multiple elements of the alloy are co-plated at the same time.

In one embodiment, three metals (e.g., Cu, Ni, W) are co-plated from an aqueous electrolyte solution using a platinum electrode (as an anode). The solution includes three or more of the following: copper sulfate, copper phosphate, nickel sulfate, nickel phosphate, and sodium tungstate ($Na_2WO_4$). In another embodiment, the aqueous electrolyte solution includes a copper compound that forms copper ions in solution, a nickel compound that forms nickel ions in solution, and a tungsten compound that produces tungsten ions in solution. The pH value of a plating solution may be adjusted by adding sulfuric acid ($H_2SO_4$) and/or sodium hydroxide (NaOH). Under the influence of a current through an anode, (for example, a spiral platinum wire), the copper, nickel, and tungsten ions are deposited on seed layer 120, which acts as a cathode.

In one embodiment, at least three metals are co-plated using a direct current (DC). In another embodiment, at least three metals are co-plated from an aqueous electrolyte solution without the use of a current. In another embodiment, at least three metals are co-plated from an aqueous electrolyte solution using a pulsed current. In one embodiment, at least three metals are co-plated using a direct current having a constant current density in a range of about 10 to about 20 milliamps per square centimeter. In one embodiment, the voltage increases as the co-plating progresses to maintain a constant current density.

In another embodiment, there is provided aqueous electrolyte solutions that have at least three types of metal ions that are deposited on a seed layer cathode under the influence of an anode when current is run through the solution. The first type of ion is copper; the second type of ion is selected from tungsten, molybdenum, titanium, tantalum, vanadium, niobium, yttrium, zirconium, ruthenium, palladium, halfnium, rhenium, and platinum; and the third type of ion is selected from of iron, cobalt, and nickel. When a suitable direct current is applied, the three metal ions are deposited onto the seed layer.

In another embodiment, a copper electrode or a copper anode is placed in an aqueous electrolyte solution that contains at least two metal ions in a solution. When a suitable direct current is supplied to the copper anode, copper ions as well as at least two other types of metal ions are deposited on the seed layer acting as a cathode. In one embodiment, a first component of the solution is metal ions selected from tungsten, molybdenum, tantalum, and titanium; and a second component of the solution is metal ions selected from iron, cobalt, and nickel.

In another embodiment a first anode is made of copper, and a second anode is made of a material selected from iron, cobalt, and nickel. In one embodiment, the first anode is copper, and the second anode is nickel, which are deposited in an aqueous electrolyte solution containing at least one other metal ion in solution. In one embodiment, the other metal ion is selected from tungsten, molybdenum, tantalum, and titanium. In one embodiment, a voltage is applied to the copper anode and the nickel anode, which produces a current that flows through the electrolyte solution and deposits copper, nickel, and at least one other metal ion on the seed layer cathode. In another embodiment, a first voltage is applied to the copper electrode, and a second voltage is applied to the nickel anode, with the seed layer cathode held at a reference voltage, in one embodiment, zero volts. The first and second voltages are used because of the different reduction potentials of copper and nickel, and/or to achieve a similar current flow rate and/or to achieve a similar metal material flow rate onto the seed layer cathode.

In another embodiment, there is provided three different metal anodes in an electrolyte solution. A voltage can be applied to the three anodes to create a flow of metal ions from the three anodes to a seed layer cathode through the electrolyte solution. In one embodiment, the first anode is made of copper. In a second embodiment, the first anode is made of copper, and the second anode is made of nickel. In another embodiment, the first anode is made of copper, and the second anode is made of a material selected from iron, cobalt, and nickel. In another embodiment, the first anode is made of copper; the second anode is made of a material selected from iron, cobalt, and nickel; and the third anode is made of a material selected from tungsten, molybdenum, tantalum, and titanium. In one embodiment, a single voltage is applied to all three anodes which creates a current flow through the electrolyte solution to deposit metal ions on the cathode seed layer. In another embodiment, a first voltage is applied to the first anode, a second voltage is applied to the second anode, and a third voltage is applied to the third anode, to create three current flows from the three anodes to the single seed layer cathode, so as to set the current and/or metal ion flow rates at desired rates.

EXAMPLES

Cu—Ni—W ternary-plating was carried out in a 250 ml Hull cell at room temperature with Princeton Applied Research 273A Computer-Controlled Potentiostat/Galvanostat. The aqueous electrolyte solutions used were 0.05~0.15 M $Cu(SO_4)$; 0.05~0.15 M Ni $SO_4$; 0.125~0.4 M $Na_2WO_4$; and 0.2 M $Na_3Citrate$. The current density used was 10~20 mA/cm$^2$. The cathodes (working electrode) were 5×5 cm$^2$ and 1×5 cm$^2$ samples from a Cu (PVD seed layer)/TaN/Ta/Si blanket test wafer. The anode (counter electrode) was a spiral Pt wire (diameter of 0.004 cm and length of 15 cm). The reference electrode was saturated Ag/AgCl. Chemical compositions of the plated films were measured with a Hitachi 4700 scanning electron microscope (SEM)/energy dispersive spectrometer (EDS) and verified with Secondary Ion Mass Spectrometry (SIMS). The crystal phase compositions of the plated films were measured with SIEMENS x-ray diffraction (XRD). Transmission electron microscope (TEM)/EDS analysis was carried out to investigate the distribution of W and Ni in Cu substrate. The effect of pH value was also investigated. The pH value of the plating solution was adjusted by adding $H_2SO_4$ and NaOH. The ternary-plated samples were annealed 4 hours at 425° C. in a vacuum oven with a background of nitrogen to protect the sample from oxidation.

Figure 7:
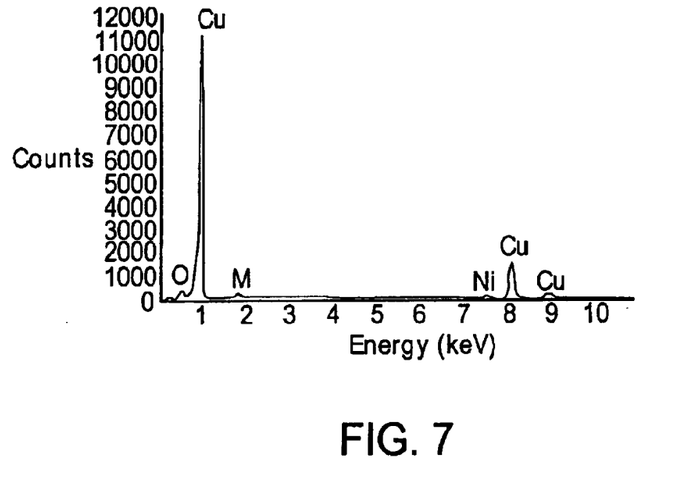
FIG. 7 is an SEM/EDS spectrum of copper-nickel-tungsten co-plated films.
Figure 8:
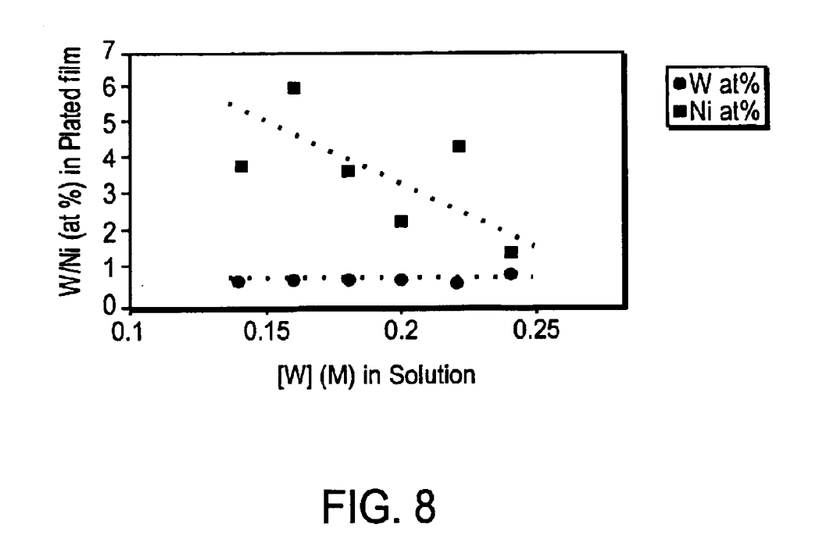
FIG. 8 is a graph showing nickel and tungsten concentrations in copper-nickel-tungsten co-plated films versus tungsten concentration in solutions (mole per liter).
Figure 9:
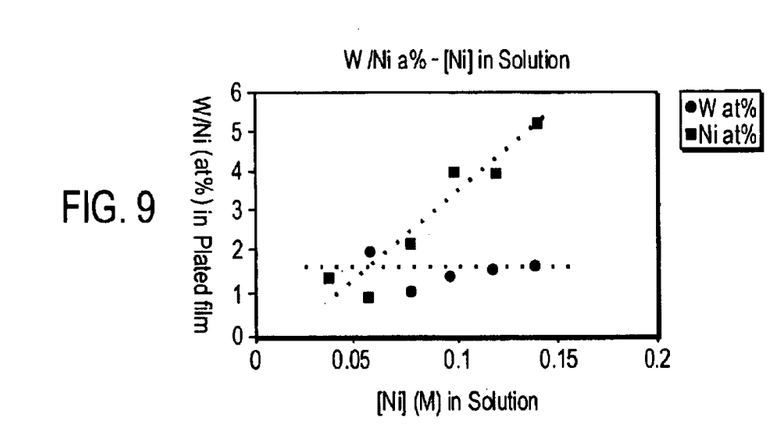
FIG. 9 is a graph showing nickel and tungsten concentrations in copper-nickel-tungsten co-plated films versus nickel concentrations in solutions (mole per liter).

The EDS spectra indicated that tungsten was successfully ternary-plated with Cu—Ni. Tungsten and nickel concentrations in the plated films were measured with SEM/EDS as shown in FIG. 7. The detected EDS spectra are $K_\alpha$ (8 keV), $K_\beta$ (8.9 keV) and $L_\alpha$ (0.93 keV) of copper, $K_\alpha$ (7.5 keV) of nickel, and $K_\alpha$ (0.53 keV) of oxygen, as well as $M_\alpha$ (1.77 keV) of tungsten, under an electron beam of 15 kV. Quantification of copper, nickel, tungsten, and oxygen was carried out by comparing Cu—$K_\alpha$, Ni—$K_\alpha$, W—$M_\alpha$, and O—$K_\alpha$ with standard references supplied with the Hitachi 4700 SEM/EDS software. Nickel and tungsten concentrations in the plated films are shown in FIGS. 8 and 9.

Cu—Ni—W ternary-plating with (1) fixed [Ni] and various [W] solution concentrations and (2) fixed [W] and various [Ni] solution concentrations were carried out to establish the effect of solution concentrations on Ni and W concentrations in the plated films. The quantitative analysis results of the EDS spectra indicate that: With fixed [Ni] in solution [Ni] in the plated films decreases with increasing [W] in solution, and [W] in the plated film does not change with changing [W] in solution (see FIG. 8); and with fixed [W] in solution, [Ni] in the plated films increases with increasing [Ni] in solution, and [W] in the plated film does not appear to change with changing [Ni] in solution (see FIG. 9).

Figure 10:
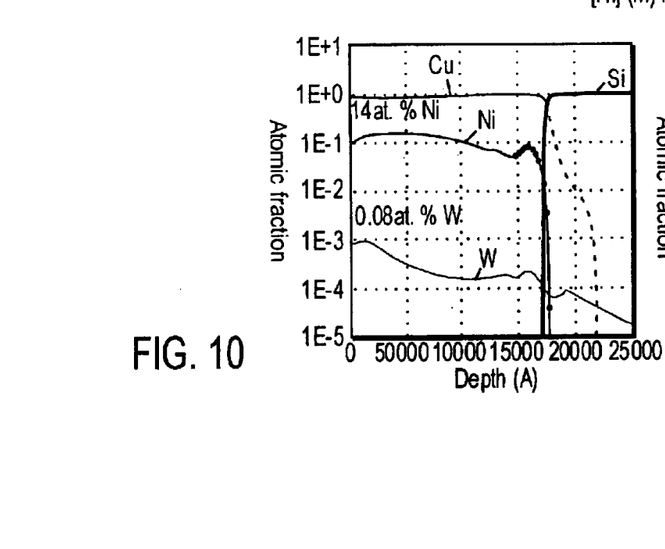
Figure 11:
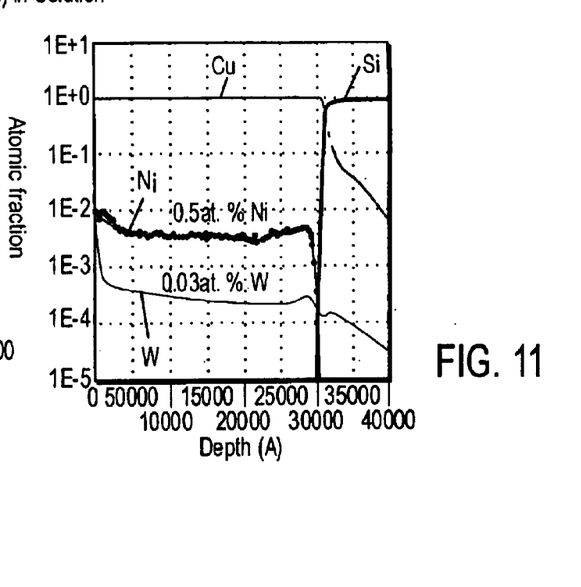

Time-of-Flight Secondary Ion Mass Spectrometry (ToFSIMS) was used to detect tungsten and nickel in the Cu—Ni—W alloy plated samples after briefly sputtering with $Ga^+$ to remove any surface oxides and organics. Profiles of tungsten and nickel concentrations versus depth from surface into the films are shown in FIGS. 10 and 11. Tungsten has a maximum concentration at the surface. Both tungsten and nickel concentrations decrease with depth of the plated film (see FIG. 10). TEM/EDS indicate the existence of high concentration areas of tungsten. Annealing four (4) hours at 425° C. in $N_2$ improved the uniformity of nickel and tungsten distributions in the plated films (see FIG. 11). This may result from the diffusion of tungsten and nickel during the annealing. Since tungsten's high melting point and the atomic radius difference between tungsten and copper the diffusion of tungsten in copper at such a low temperature is expected to be limited.

Transmission electron micrograph was taken of copper-nickel-tungsten coplated film after annealing 4 hours at 425° C. in vacuum oven with $N_2$. The plated film includes two types of phases with different densities. Small dark (higher density) crystalline phase in a dimension of about 10 to 20 nm are widely dispersed within the amorphous matrix (lower density). TEM/EDS spectra indicate that copper, 3 to 5% nickel, and oxygen exist all through the film. The crystalline grains contain mainly copper, 3 to 5% nickel, oxygen, and a very small amount of tungsten. The amorphous matrix contains no tungsten. Experiments with different pH values, but same copper, nickel and tungsten concentrations in the solutions indicated that the pH value (6~8) does not change nickel and tungsten concentrations in the plated films nor the resistivity of the plated films. But the surface brightness decreases with the decrease of pH.

Figure 12:
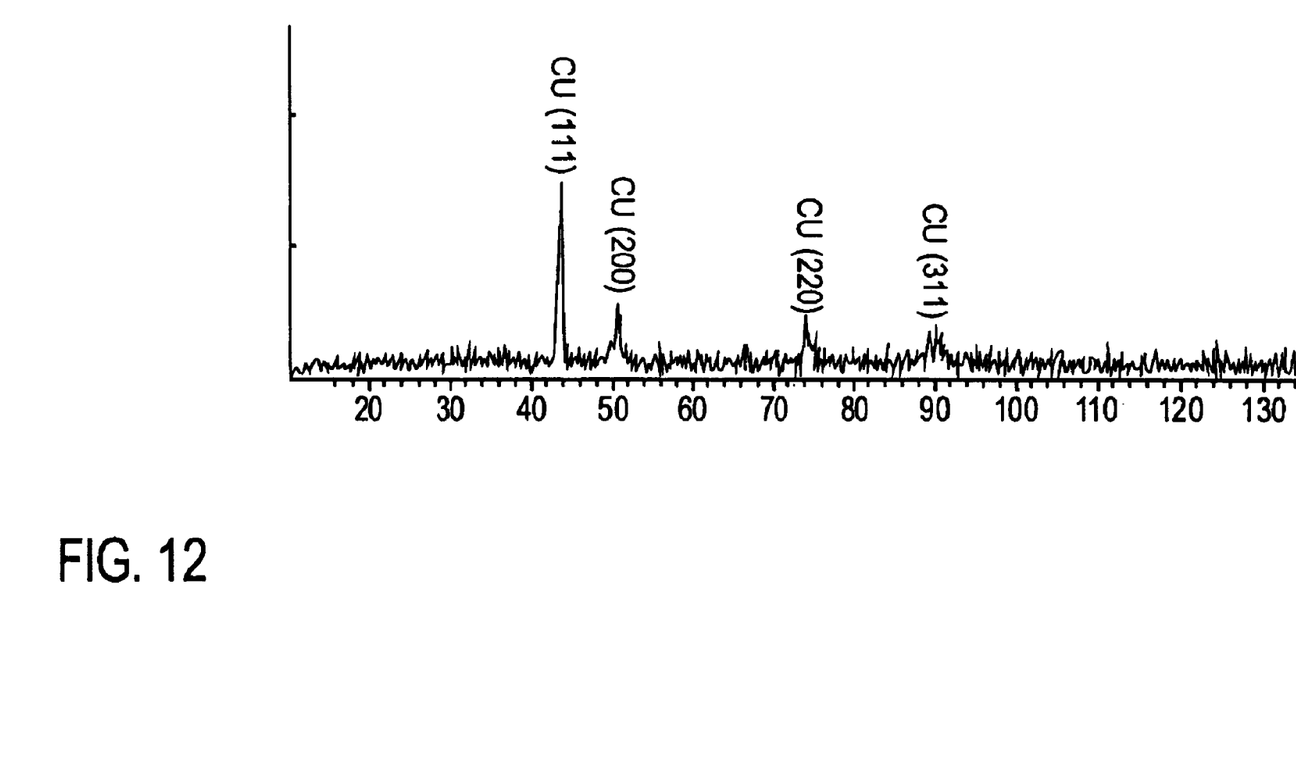
FIG. 12 shows an XRD spectrum of copper-nickel-tungsten co-plated film.

XRD spectra (FIG. 12) show only the spectra of pure copper, that is Cu (111) at 2θ=43.356°, Cu (200) at 2θ=50.496°, Cu (220) at 2θ=74.201°, and Cu (311) at 2θ=90.360°, with Cu $K_\alpha$ (λ=1.5418 Å) radiation. This indicates that the co-plated tungsten and nickel were not interstitially dissolved in the copper solid solution. Copper and nickel have similar atomic radii, 1.28 Å and 1.24 Å respectively. It is known that copper and nickel may form a continuous solid solution. While tungsten has an atomic radius of 1.41 Å, 10.15% larger than that of copper. So tungsten is very unlikely dissolved in copper, as can be seen in a Cu—W phase diagram. The fact that no spectrum shift to lower angle was seen conforms to this. Therefore tungsten was very likely distributed on grain boundaries of copper-nickel alloy crystalline phase.

Figure 6:
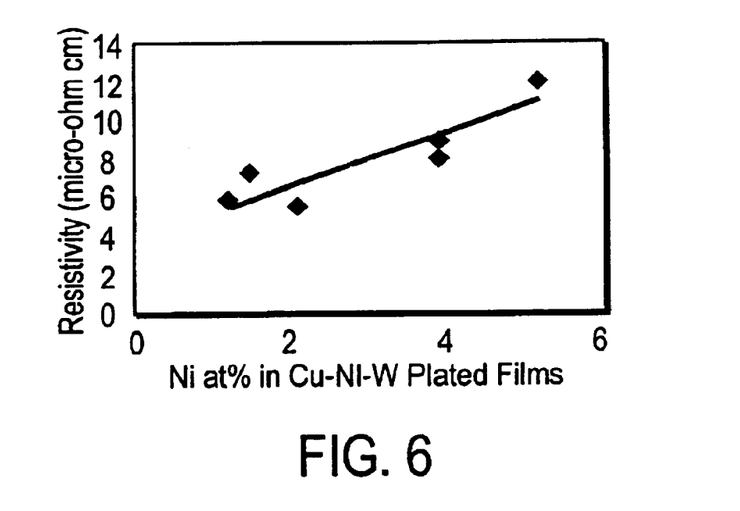
FIG. 6 is a graph showing resistivity versus nickel concentration in copper-nickel-tungsten co-plated films.

Resistivity versus nickel concentration of the Cu—Ni—W ternary-plated films is plotted in FIG. 6. It is shown that resistivity increases with the increase of nickel concentration in the plated films. From the plot we can get: The resistivity increase per atomic percent addition of nickel in the plated films is approximately 1.3 $\mu\Omega$cm/at. %. With the existence of an average of 1.4 at. % tungsten in the films, resistivity increased about 2 $\mu\Omega$cm compare to pure copper.

In the preceding detailed description, specific embodiments were described. It will, however, be evident that various modifications and changes may be made thereto without departing from the broader spirit and scope as set forth in the claims. The specification and drawings are, accordingly, to be regarded in an illustrative rather than a restrictive sense.

What is claimed is:

1. An apparatus comprising:
    a contact point on an integrated circuit substrate; and
    an interconnection including a metal alloy including at least three elements coupled to the contact point, the metal alloy including a group IB metal and a material selected from the group consisting of iron, cobalt, and nickel, and adapted to transmit electronic signals to and from the contact point,
    wherein the contact point includes at least one of a circuit device and a second interconnection.

2. The apparatus of claim 1, wherein the metal alloy comprises:
    a first material selected from the group consisting of iron, cobalt, and nickel; and
    a second material selected from the group consisting of tungsten, molybdenum, tantalum, titanium, vanadium, niobium, yttrium, zirconium, ruthenium, palladium, hafnium, rhenium, and platinum.

3. The apparatus of claim 1, wherein the metal alloy comprises copper, nickel, and tungsten.

4. An apparatus comprising:
    a substrate comprising an interior of a multilayer apparatus;
    a conductive seed layer exterior to the substrate; and
    a metal alloy interconnection comprising at least three elements, the metal alloy comprising a group IB metal and a material selected from the group consisting of iron, cobalt, and nickel; the metal alloy exterior to the conductive seed layer and exterior to the substrate and adapted to transmit electronic signals to and from the seed layer.

5. The apparatus of claim 4, further comprising:
a first layer comprising a material selected from the group consisting of tantalum, tungsten, cobalt, titanium, and mixtures thereof, the first layer exterior to the substrate, interior to the conductive seed layer, and interior to the metal alloy layer.

6. The apparatus of claim 4, further comprising:
a first layer comprising a material selected from the group consisting of tantalum, tungsten, cobalt, titanium, and mixtures thereof, the first layer exterior to the substrate, interior to the conductive seed layer, and interior to the metal alloy layer; and
a second layer comprising a material selected from the group consisting of titanium-nitride, tantalum-nitride, and mixtures thereof, the second layer exterior to the substrate, interior to the first layer, interior to the conductive seed layer, and interior to the metal alloy layer.

7. The apparatus of claim 4, wherein the metal alloy layer comprises copper.

8. The apparatus of claim 4, wherein the metal alloy layer comprises:
copper;
a first material selected from the group consisting of iron, cobalt, and nickel; and
a second material selected from the group consisting of tungsten, molybdenum, tantalum, and titanium.

9. The apparatus of claim 4, wherein the metal alloy layer comprises:
copper; and
tungsten.

10. The apparatus of claim 4, wherein the metal alloy layer comprises copper, nickel, and tungsten.

11. The multilayer apparatus of claim 4, the substrate further comprising a contact point; and wherein the conductive seed layer is coupled to the contact point; and wherein the metal alloy layer is coupled to the conductive seed layer.

12. A multilayer interconnection structure comprising at least three elements formed on a substrate including a barrier layer, and a conductive seed layer, wherein the interconnection structure includes a metal alloy layer including a group IB metal and a material selected from the group consisting of iron, cobalt, and nickel; the metal alloy layer adapted to transmit electronic signals to or from each layer of the interconnection.

13. The multilayer interconnection structure of claim 12, wherein the electroplated metal alloy layer comprises copper.

14. The multilayer interconnection structure of claim 12, wherein the metal alloy layer comprises:
a material selected from the group consisting of tungsten, molybdenum, tantalum, and titanium.

15. The multilayer interconnection structure of claim 12, wherein the metal alloy layer comprises:
tungsten.

16. The multilayer interconnection structure of claim 12, wherein the metal alloy layer comprises a group IB metal, nickel, and tungsten.

* * * * *